United States Patent
Brune et al.

(10) Patent No.: US 7,802,152 B2
(45) Date of Patent: Sep. 21, 2010

(54) METHOD AND APPARATUS FOR RECORDING HIGH-SPEED INPUT DATA INTO A MATRIX OF MEMORY DEVICES

(75) Inventors: Thomas Brune, Hannover (DE); Jens Peter Wittenburg, Isernhagen (DE)

(73) Assignee: Thomson Licensing, Boulogne-Billancourt (FR)

( * ) Notice: Subject to any disclaimer, the term of this patent is extended or adjusted under 35 U.S.C. 154(b) by 286 days.

(21) Appl. No.: 12/087,708

(22) PCT Filed: Dec. 4, 2006

(86) PCT No.: PCT/EP2006/069265
§ 371 (c)(1),
(2), (4) Date: Jul. 11, 2008

(87) PCT Pub. No.: WO2007/080031
PCT Pub. Date: Jul. 19, 2007

(65) Prior Publication Data
US 2009/0083591 A1    Mar. 26, 2009

(30) Foreign Application Priority Data
Jan. 16, 2006    (EP) ................................. 06090010

(51) Int. Cl.
*G11C 29/00* (2006.01)
(52) U.S. Cl. .................. 714/710; 714/718; 714/54; 714/711; 714/723; 714/30; 714/7; 714/6; 714/42; 714/5; 714/8; 711/156; 711/159; 711/200; 711/100; 711/103; 711/202; 365/185.01; 365/185.33; 365/201; 365/200

(58) Field of Classification Search ....................... None
See application file for complete search history.

(56) References Cited

U.S. PATENT DOCUMENTS 5,864,661 A * 1/1999 Ohara .......................... 714/42
7,602,642 B2 * 10/2009 Choi ....................... 365/185.09

(Continued)

OTHER PUBLICATIONS

Search Report Dated Feb. 14, 2007.

*Primary Examiner*—John P Trimmings
(74) *Attorney, Agent, or Firm*—Robert D. Shedd; Jeffrey M. Navon

(57) ABSTRACT

For recording or replaying in real-time digital high bandwidth video signals, e.g. HDTV, HD progressive or HD film capture signals, very fast memories are required. For storage of streaming HD video data NAND FLASH memory based systems could be used. Flash memory devices are physically accessed in a page oriented mode. According to the invention, the input data are written in a multiplexed fashion into a matrix of multiple flash devices. A list processing is performed that is as simple and fast as possible, and defect pages of flash blocks of single flash devices are addressed within the matrix architecture. When writing in a sequential manner, the data content for the current flash device page of all flash devices of the matrix is copied to a corresponding storage area in an additional memory buffer. After the current series of pages has been written without error into the flash devices, the corresponding storage area in an additional memory buffer is enabled for overwriting with following page data. In case an error occurred in the current page in one or more flash devices, the content of these current pages is kept in the additional memory buffer.

14 Claims, 3 Drawing Sheets

U.S. PATENT DOCUMENTS

Figure 1:
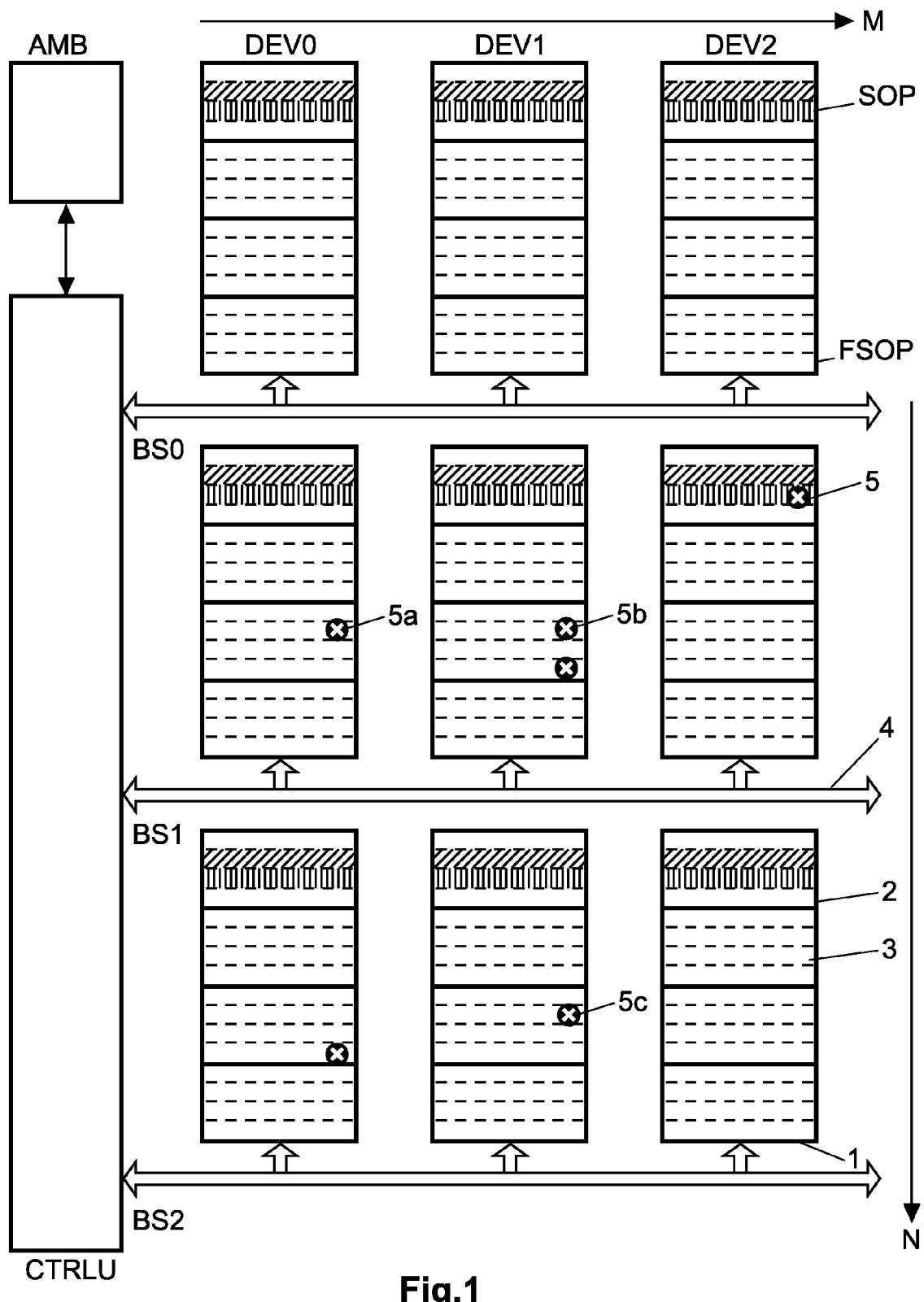

| | | | |
|---|---|---|---|
| 2002/0184436 A1* | 12/2002 | Kim et al. | 711/103 |
| 2003/0196029 A1* | 10/2003 | Komatsu et al. | 711/103 |
| 2004/0030957 A1* | 2/2004 | Yadavalli et al. | 714/30 |
| 2004/0153902 A1* | 8/2004 | Machado et al. | 714/710 |
| 2004/0255076 A1* | 12/2004 | Oyaizu et al. | 711/103 |
| 2005/0169045 A1* | 8/2005 | Yamagami et al. | 365/158 |
| 2006/0259829 A1* | 11/2006 | Keays | 714/42 |

* cited by examiner

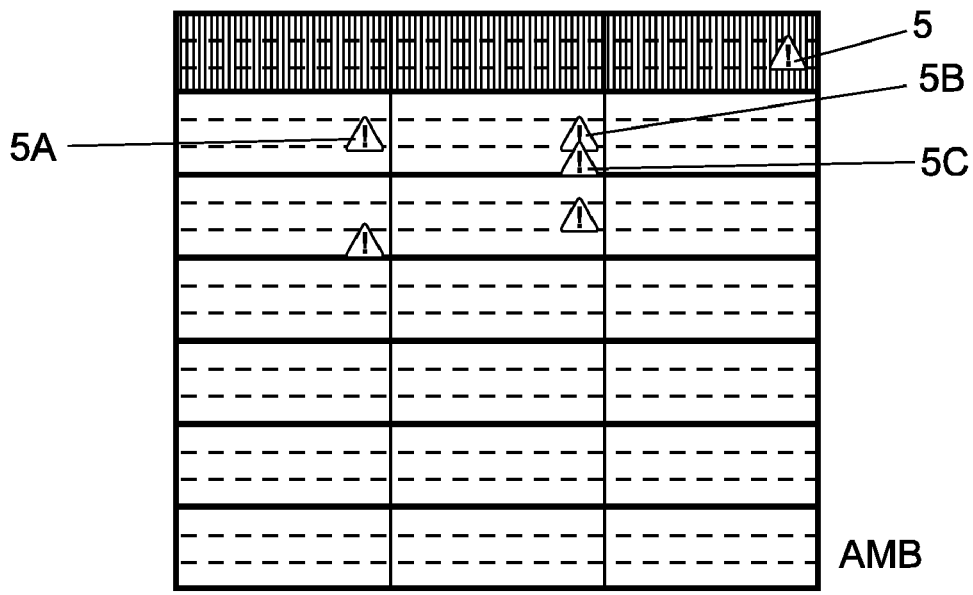
Fig.2
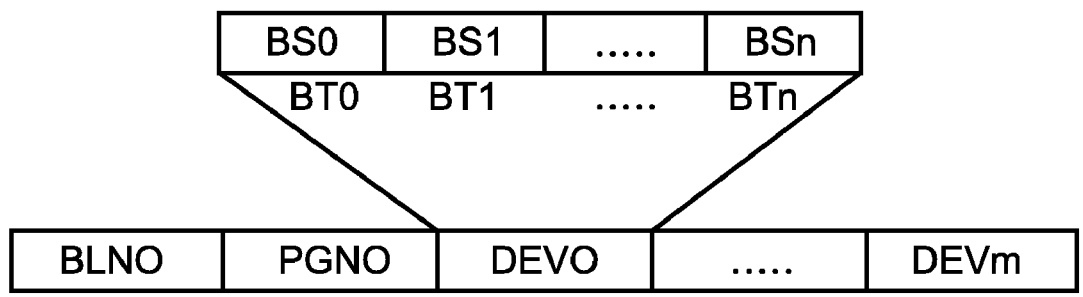
Fig.3
| "0" | "2" | "000.000.010" |
|---|---|---|
| "2" | "1" | "010.011.000" |
| "2" | "3" | "001.010.000" |
| "INV" | n.a. | n.a. |
| "INV" | n.a. | n.a. |
BTMP
Fig.4

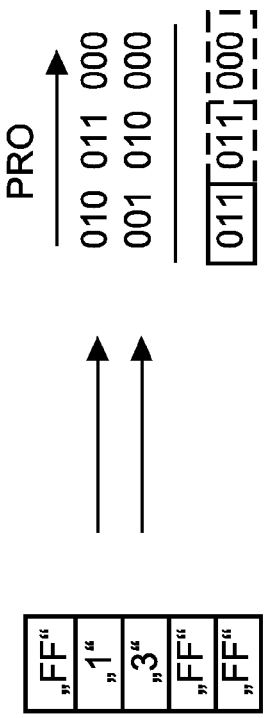
Fig.5
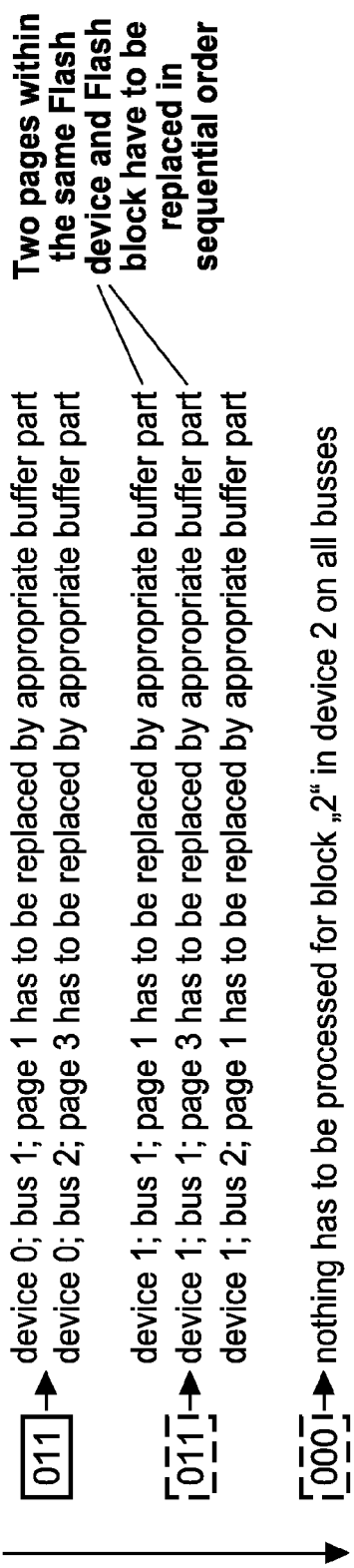
Fig.6
Fig.7

METHOD AND APPARATUS FOR RECORDING HIGH-SPEED INPUT DATA INTO A MATRIX OF MEMORY DEVICES

This application claims the benefit, under 35 U.S.C. §365 of International Application PCT/EP 2006/069265, filed Dec. 4, 2006, which was published in accordance with PCT Article 21(2) on Jul. 19, 2007 in English and which claims the benefit of European patent application No. 06090010.7, filed Jan. 16, 2006.

The invention relates to a method and to an apparatus for recording high-speed input data into a matrix of memory devices.

BACKGROUND

For recording or replaying in real-time digital high bandwidth video signals, e.g. HDTV, HD progressive or HD film capture signals, very fast memories are required. For storage of streaming HD video data NAND FLASH memory based systems could be used. Flash memory devices are physically accessed in a page oriented mode, whereby one 'page' includes e.g. 1024 data words and related error correction code (ecc). Erase operations on a specific flash memory can be carried out on certain-size data blocks only. These data blocks are denoted by the term 'flash block' in the following. A flash block consists of e.g. 64 pages. NAND flash memories have two basic disadvantages:

the write access is rather slow;
they have unmasked production defects and acquire even more defects during their lifetime. The required error handling is under user responsibility. This is also true for equivalent memory types.

Since a detection of defects in flash memory devices (e.g. NAND devices) takes place for instance during an erase operation, a defect in a page makes an entire flash block unusable. Such defect flash blocks must not be used by the file system. The handling of such defects is fully under user responsibility.

It is known to use redundancy codes like Reed-Solomon for such error processing, but that has other disadvantages like high dynamic time consumption versus real-time behaviour. For example, the following NAND flash memories are on the market: Samsung K9K2G16U0M-YCB000 (2 Gbit, 16 bit oriented), K9W4G08U0M-YCB000 (4 Gbit, 8 bit oriented), Toshiba TH58NVG2S3BFT00 (4 Gbit, 8 bit oriented), MICRON MT29G08AAxxx (2 Gbit, 8 bit oriented), MT29G16AAxxx (2 Gbit, 16 bit oriented), Samsung K9K4G08 (4 Gbit, 8 bit oriented).

INVENTION

The invention can be used for real-time recording of high definition streaming video data on NAND flash memory based devices. Using flash devices while recording in real-time at high data throughput will result in big files or takes, respectively. It is important to have a resource and performance efficient processing for dynamical defect remapping from faulty flash blocks towards free flash blocks. Today's most NAND flash applications are Reed-Solomon error protected and not real-time capable.

A problem to be solved by the invention is to provide a resource and performance efficient algorithm for remapping defects in FLASH devices that occur while in operation, to support low power consumption, short operation time and real-time capability. This problem is solved by the method disclosed in claim 1. An apparatus that utilises this method is disclosed in claim 2.

According to the invention, high-speed input data are written in a multiplexed fashion into a matrix of multiple flash devices. A list processing is performed that is as simple and fast as possible, and defect pages of flash blocks of single flash devices are addressed within the matrix architecture. When writing in a sequential manner, the data content for the current flash device page of all flash devices of the matrix is also copied to a corresponding storage area in an additional memory buffer. After the current series of pages has been written without error into the flash devices, the corresponding storage area in an additional memory buffer is enabled for overwriting with following page data. In case an error occurred in the current page in one or more flash devices, the content of these current pages is kept in the additional memory buffer.

In principle, the inventive method is suited for recording high-speed input data into a matrix of memory devices of a first type, said matrix including at least two memory devices per row and at least two memory devices per column, wherein the memory devices of a row are connected to a common bus and to each row of said matrix a separate common bus is assigned, and wherein said memory devices each are internally arranged in multiple pages to which pages input data can be written in a sequential manner, and wherein when writing into said first type memory devices defects may occur at different locations in said memory devices, said method including the steps:

A) writing a first section of input data in a multiplexed manner, using said common buses, in the same current page of the memory devices, starting with the first column of memory devices, column by column, and writing this first section of input data also in a corresponding section of an additional memory device of a second type different from said first type;

B) checking whether or not at least one defect in at least one memory device has occurred while writing said first section of input data into said current page of the memory devices;

C) writing the following section of input data in a multiplexed manner, using said common buses, in the following page of the memory devices, starting with the first column of memory devices, column by column, and if no defect has been found in the foregoing step, also writing this following section of input data in the same section of said additional memory device, and if a defect has been found in the foregoing step, also writing this following section of input data in a following corresponding section of said additional memory device;

D) checking whether or not at least one defect in at least one memory device has occurred while writing said following section of input data into said following page;

E) continuing with steps C) and D) until all sections of input data have been written into said matrix of memory devices and into said additional memory device;

F) copying input data stored in corresponding sets of pages of said matrix of memory devices, which sets include per set at least one defect in at least one memory device, to corresponding sets of pages in said matrix of memory devices which are not yet occupied with said input data, thereby taking input data of defect single pages not from said matrix of memory devices but from corresponding single page data stored in said additional memory device.

In principle the inventive apparatus is suited for recording high-speed input data into a matrix of memory devices of a first type, said matrix including at least two memory devices per row and at least two memory devices per column, wherein the memory devices of a row are connected to a common bus and to each row of said matrix a separate common bus is assigned, and wherein said memory devices each are internally arranged in multiple pages to which pages input data can be written in a sequential manner, and wherein when writing into said first type memory devices defects may occur at different locations in said memory devices, said apparatus including an additional memory device of a second type different from said first type and means being adapted for carrying out the following functions:

A) writing a first section of input data in a multiplexed manner, using said common buses, in the same current page of the memory devices, starting with the first column of memory devices, column by column, and writing this first section of input data also in a corresponding section of said additional memory device;

B) checking whether or not at least one defect in at least one memory device has occurred while writing said first section of input data into said current page of the memory devices;

C) writing the following section of input data in a multiplexed manner, using said common buses, in the following page of the memory devices, starting with the first column of memory devices, column by column, and if no defect has been found in the foregoing function, also writing this following section of input data in the same section of said additional memory device, and if a defect has been found in the foregoing function, also writing this following section of input data in a following corresponding section of said additional memory device;

D) checking whether or not at least one defect in at least one memory device has occurred while writing said following section of input data into said following page;

E) continuing with functions C) and D) until all sections of input data have been written into said matrix of memory devices and into said additional memory device;

F) copying input data stored in corresponding sets of pages of said matrix of memory devices, which sets include per set at least one defect in at least one memory device, to corresponding sets of pages in said matrix of memory devices which are not yet occupied with said input data, thereby taking input data of defect single pages not from said matrix of memory devices but from corresponding single page data stored in said additional memory device.

Advantageous additional embodiments of the invention are disclosed in the respective dependent claims.

DRAWINGS

Exemplary embodiments of the invention are described with reference to the accompanying drawings, which show in:

FIG. 1 matrix of flash devices;

FIG. 2 extra buffer containing non-faulty data copies of faulty flash pages;

FIG. 3 entry of a defects list;

FIG. 4 example defects list;

FIG. 5 page register array;

FIG. 6 bitmap register;

FIG. 7 page replacement sequence.

EXEMPLARY EMBODIMENTS

It is advantageous for real-time recording to have the flash devices organised within a matrix that is connected by several busses BS0, BS1, BS2, . . . to a controller unit CTRLU as depicted in FIG. 1. Several flash devices are sharing the same data bus, for example devices DEV0 to DEV2 share bus BS0. More generally, the number of flash devices sharing the same data bus is M. There are several such flash device/common bus rows in the matrix, their number is N. The matrix includes at least two memory devices per row and at least two memory devices per column. The controller unit CTRLU may receive the high-speed input data to be stored or recorded. Regarding an 'erase' operation, the smallest addressable unit in a NAND flash memory like device 1 is a flash block 2 (depicted with a bold surrounding, i.e. in the figure device 1 has four flash blocks).

Regarding a 'write' operation, the smallest addressable unit in a NAND flash memory is a flash page 3 (in the figure each flash block contains four flash pages).

In one implementation, the total number of flash blocks in the matrix is e.g. 4096. Each block may contain 64 pages. The input data to be stored are multiplexed and are written via the N parallel buses into the same current page in each of the flash devices in the first column of the matrix, i.e. into device DEV0 and the devices arranged below it. After this current page is full, the following input data are written into the same current page in the second column of the matrix, i.e. into device DEV1 and the devices arranged below it. This write processing is continued M times until the current page of all flash devices of the matrix is filled with input data. This status is depicted by the diagonal hatching of the second page in the flash devices. Thereafter the write processing is continued with the next (i.e. the third) page in the flash devices, which third page is marked in FIG. 1 by a vertical hatching. These pages form a set of pages SOP.

For achieving a high-speed real-time recording and defect recovery, the data content for the current flash page of all flash devices of the matrix is in each case copied in a sequential manner to an additional memory buffer AMB (e.g. an SRAM) which can be connected to controller unit CTRLU or to the buses, and these data will remain in buffer AMB if one or more defects have occurred in the current page in one or more of the flash devices of the matrix.

The extra buffer AMB is shown in FIG. 2 in more detail. The matrix depicted in FIG. 1 includes nine flash devices. The first column of devices in the matrix is related to the first column in memory AMB, the second column in the matrix is related to the second column in memory AMB, and so on. A line in memory AMB is related to a page in a row of devices in the matrix.

When writing into the third page (marked by vertical hatching) in the flash devices of the matrix an error or defect 5 has occurred. Therefore the original input data content of these pages is kept stored in the corresponding area (marked by vertical hatching) in memory AMB, i.e. it is kept stored in AMB without defect 5. Therefore, when the next series of pages (i.e. the fourth page) is written in the flash devices, the original input data are written into the following section in memory AMB (i.e. lines 3 to 6 in FIG. 2). In case no defect has occurred in any of the fourth pages, this section (lines 3 to 6) in memory AMB is overwritten by the next series of pages (i.e. the fifth page). Because three defects 5*a*, 5*b* and 5*c* occur in the tenth page (i.e. in block three of the flash devices), the original input data content of these pages is kept stored in the corresponding area (lines 3 to 6) in memory AMB without defects at corresponding locations 5A, 5B and 5C.

In effect, under the control of controller unit CTRLU, buffer AMB stores non-faulty data copies of faulty flash pages but its capacity is significantly smaller than that of the flash matrix. For example, RAM memory AMB can have a capacity such that the data content of up to 15 different pages of each device of the matrix can be stored therein.

The page errors (e.g. 5, 5a, 5b and 5c) which occurred during real-time recording are marked in a defects list, an entry of which defects list is shown in FIG. 3. That entry may contain the block number BLNO (0 . . . B), the page number PGNO (0 . . . P), and the device column number DEV0, . . . , DEVm in the FLASH matrix. The bits BT0, BT1, . . . , BTn in the column number indicate in which row number (=bus number BS0, BS1, . . . , BSn) of the matrix a defect or multiple defects have occurred in a flash page. It is not necessary to store the location within a page of a defect.

An example defects list for the nine flash devices depicted in FIG. 1 is shown in FIG. 4. This list can be stored in controller unit CTRLU. This example defects list defines the defect pages in the FIG. 1 matrix.

A first defect 5 is located in block number BLNO=0 in page number PGNO=2, and according to the bitmap part BTMP in the third device column DEV2 with respect to the second bus BS1.

A second defect 5a is located in block number BLNO=2 in page number PGNO=1 in the first device column DEV0 with respect to the second bus BS1.

A third defect 5b is located in block number BLNO=2 in page number PGNO=1 in the second device column DEV1 with respect to the second bus BS1.

A fourth defect 5c is located in block number BLNO=2 in page number PGNO=1 in the second device column DEV1 with respect to the third bus BS2.

Further defects are located in block number BLNO=2 in page number PGNO=3 in the first device column DEV0 with respect to the third bus BS2 and in the second device column DEV1 with respect to the second bus BS1.

Upon or while writing the input data into the flash devices, the flash devices report any defects via the buses BS0 to BS2 to controller unit CTRLU.

The respective flash page copies have to remain buffered. When recovering the defects, it is advantageous that the defects list is analysed in a resource and time efficient manner, to support low power consumption, short operation time and real-time behaviour. Target is that the content of a flash block that contains one or more faulty flash pages is copied to corresponding sets FSOP of free flash pages in a free flash block within the same flash device. At last the faulty flash block has to be logically re-mapped by the new flash block in e.g. a file system.

Hereby the task of analysing the defects list that contains information about the flash block, the flash page, device and bus of every defect is described in detail below. During analysing processing, the appropriate defect flash page within a block is to be copied from the buffer to the new flash block. All other flash pages within a block are to be copied from the faulty flash block to the new flash block. Determining defect flash pages of a flash block:

a) Initialise a register array for 'page' values with invalid values (FIG. 5 shows a corresponding page register array containing defect pages for flash block BLNO=2, which page register contains the corresponding page number values from column PGNO for the rows concerning BLNO=2);

b) Make the first valid 'block' value BLNO out of the defects list a 'reference block' value;

c) Copy the corresponding 'page' value from the defects list into the appropriate field in the page register array;

d) Analyse the next defects list entry;

e) If the current 'block' value BLNO equals the 'reference block' value go to step c) else go to step d);

f) Loop steps c) to e) until the end of the defects list is reached.

FIG. 6 shows a bitmap register for storing the bitmaps for the page entries processed in step c). The bitmaps for these pages are processed in a sequential processing order PRO (every N bits). The bitmap register is used to shortcut non-defect flash devices:

g) Initialise a pointer for the bitmap and for a 'device counter';

h) Initialise a pointer for the page register array. Initialise the bitmap register with zeroes;

i) Address a single cell in the page register array;

j) If its entry is valid go to step k) else go to step l);

k) Load N bits from the corresponding bitmap (stored in the defects list) and logically OR that with the corresponding bitmap register values (N=number of busses);

l) Increment the page register array pointer and go to step i) until the end of the page register array is reached;

m) If the bitmap register value equals zero then increment the bitmap pointer and the 'device counter' and go to step h) until the end of the bitmap is reached. If the bitmap register value not equals zero then start the following steps n) to u).

FIG. 7 explains a page replacement sequence according to a bitmap register and bitmap analysis. The goal is to determine the bus for a defect block in a defect flash device and to copy corresponding flash pages:

n) Initialise a 'bus count' and the pointer for the page register array;

o) Read the page register array (FIG. 5) for a valid value;

p) Analyse the bit in the bitmap register where 'bus count' is pointing to: if that bit equals zero, increment 'bus count' and go to step o), if that bit equals one, go to step q);

q) For all page values between zero and the value read in step o) minus one, copy flash pages from the faulty flash block to a new flash block. The reference flash device number corresponds to value 'device counter', the reference bus number corresponds to value 'bus count';

r) For the page value read in step o), copy the corresponding flash page data from the additional memory buffer AMB to the new flash block. The reference flash device number corresponds to value 'device counter', the reference bus number corresponds to value 'bus count';

s) Increment the pointer for the page register array and go to step o) until the end of the page register array is reached;

t) Update a 'block remap table' for the appropriate device and mark the corresponding block entry in the defects list as invalid;

u) Go to step a).

The above registers, pointers, list and table can be controlled by controller unit CTRLU.

The invention can be used in any block oriented storage that can be affected with defects during lifetime.

The invention claimed is:

1. A method for recording high-speed input data into a matrix of memory devices of a first type, said matrix including at least two memory devices per row and at least two memory devices per column, wherein the memory devices of a row are connected to a common bus and to each row of said matrix a separate common bus is assigned, and wherein said memory devices each are internally arranged in multiple pages to which pages input data can be written in a sequential manner, and wherein when writing into said first type memory devices defects may occur at different locations in said memory devices, said method comprising the steps:

A) writing a first section of input data in a multiplexed manner, using said common buses, in the same current page of the memory devices, starting with the first column of memory devices, column by column, and writing this first section of input data also in a corresponding section of an additional memory device of a second type different from said first type;

B) checking whether or not at least one defect in at least one memory device has occurred while writing said first section of input data into said current page of the memory devices;

C) writing the following section of input data in a multiplexed manner, using said common buses, in the following page of the memory devices, starting with the first column of memory devices, column by column, and if no defect has been found in the foregoing step, also writing this following section of input data in the same section of said additional memory device, and if a defect has been found in the foregoing step, also writing this following section of input data in a following corresponding section of said additional memory device;

D) checking whether or not at least one defect in at least one memory device has occurred while writing said following section of input data into said following page;

E) continuing with steps C) and D) until all sections of input data have been written into said matrix of memory devices and into said additional memory device;

F) copying input data stored in corresponding sets of pages of said matrix of memory devices, which sets include per set at least one defect in at least one memory device, to corresponding sets of pages in said matrix of memory devices which are not yet occupied with said input data, thereby taking input data of defect single pages not from said matrix of memory devices but from corresponding single page data stored in said additional memory device.

2. The method according to claim 1, wherein said first type memory devices are FLASH memories.

3. The method according to claim 1, wherein said defects are stored in a defects list that contains information items about the corresponding page, the corresponding memory device and the corresponding bus for each defect.

4. The method according to claim 3, wherein said defects are stored in a defects list that contains information items about the corresponding block, the corresponding page, the corresponding memory device and the corresponding bus for each defect.

5. The method according to claim 4, wherein defect flash pages of a flash block are determined as follows:

a) initializing a register array for 'page' values with invalid values;

b) making the first valid 'block' value BLNO out of the defects list a 'reference block' value;

c) copying the corresponding 'page' value from the defects list into the appropriate field in said page register array;

d) analyzing the next defects list entry;

e) if the current 'block' value BLNO equals the 'reference block' value, continuing with step c) else continuing with step d);

f) continuing steps c) to e) until the end of said defects list is reached.

6. The method according to claim 5, wherein a bitmap register for storing the bitmaps for the page entries processed in step c) is generated and every N bits of the bitmaps for these pages are processed in a sequential processing order and said bitmap register is used to shortcut non-defect flash devices, said bitmap register being generated as follows:

g) initializing a pointer for the bitmap and for a 'device counter';

h) initializing a pointer for said page register array and initializing said bitmap register with zeroes;

i) addressing a single cell in said page register array;

j) if its entry is valid, continuing with step k) else continuing with step l);

k) loading N bits from the corresponding bitmap stored in said defects list and logically ORing that with the corresponding bitmap register values;

l) incrementing the page register array pointer and continuing with step i) until the end of said page register array is reached;

m) if the bitmap register value equals zero, incrementing the bitmap pointer and said 'device counter' and continuing with step h) until the end of the bitmap is reached.

7. The method or apparatus according to claim 6 wherein, if in step m) said bitmap register value not equals zero, the following steps are carried out in order to determine the bus for a defect block in a defect flash device and to copy corresponding flash pages:

n) initializing a 'bus count' and the pointer for said page register array;

o) reading said page register array for a valid value;

p) analyzing the bit in said bitmap register where 'bus count' is pointing to: if that bit equals zero, incrementing 'bus count' and continuing with step o), if that bit equals one, continuing with step q);

q) for all page values between zero and the value read in step o) minus one, copying flash pages from the faulty flash block to a new flash block, whereby the reference flash device number corresponds to value 'device counter' and the reference bus number corresponds to value 'bus count';

r) for the page value read in step o), copying the corresponding flash page data from said additional memory buffer to the new flash block, whereby the reference flash device number corresponds to value 'device counter' and the reference bus number corresponds to value 'bus count';

s) incrementing the pointer for said page register array and continuing with step o) until the end of said page register array is reached;

t) updating a 'block remap table' for the appropriate device and marking the corresponding block entry in said defects list as invalid;

u) continuing with step a) in claim 5.

8. An apparatus for recording high-speed input data into a matrix of memory devices of a first type, said matrix including at least two memory devices per row and at least two memory devices per column, wherein the memory devices of a row are connected to a common bus and to each row of said matrix a separate common bus is assigned, and wherein said memory devices each are internally arranged in multiple pages to which pages input data can be written in a sequential manner, and wherein when writing into said first type memory devices defects may occur at different locations in said memory devices, said apparatus comprising an additional memory device of a second type different from said first type and means being adapted for carrying out the following functions:

A) writing a first section of input data in a multiplexed manner, using said common buses, in the same current page of the memory devices, starting with the first column of memory devices, column by column, and writing this first section of input data also in a corresponding section of said additional memory device;

B) checking whether or not at least one defect in at least one memory device has occurred while writing said first section of input data into said current page of the memory devices;

C) writing the following section of input data in a multiplexed manner, using said common buses, in the following page of the memory devices, starting with the first column of memory devices, column by column, and if no defect has been found in the foregoing function, also writing this following section of input data in the same section of said additional memory device, and if a defect has been found in the foregoing function, also writing this following section of input data in a following corresponding section of said additional memory device;

D) checking whether or not at least one defect in at least one memory device has occurred while writing said following section of input data into said following page;

E) continuing with functions C) and D) until all sections of input data have been written into said matrix of memory devices and into said additional memory device;

F) copying input data stored in corresponding sets of pages of said matrix of memory devices, which sets include per set at least one defect in at least one memory device, to corresponding sets of pages in said matrix of memory devices which are not yet occupied with said input data, thereby taking input data of defect single pages not from said matrix of memory devices but from corresponding single page data stored in said additional memory device.

9. The apparatus according to claim 8, wherein said defects are stored in a defects list that contains information items about the corresponding page, the corresponding memory device and the corresponding bus for each defect.

10. The apparatus according to claim 8, wherein said first type memory devices are FLASH memories.

11. The apparatus according to claim 10 wherein said defects are stored in a defects list that contains information items about the corresponding block, the corresponding page, the corresponding memory device and the corresponding bus for each defect.

12. The apparatus according to claim 11, wherein defect flash pages of a flash block are determined as follows:

a) initializing a register array for 'page' values with invalid values;

b) making the first valid 'block' value BLNO out of the defects list a 'reference block' value;

c) copying the corresponding 'page' value from the defects list into the appropriate field in said page register array;

d) analyzing the next defects list entry;

e) if the current 'block' value BLNO equals the 'reference block' value, continuing with step c) else continuing with step d);

f) continuing steps c) to e) until the end of said defects list is reached.

13. The apparatus according to claim 12, wherein a bitmap register for storing the bitmaps for the page entries processed in step c) is generated and every N bits of the bitmaps for these pages are processed in a sequential processing order and said bitmap register is used to shortcut non-defect flash devices, said bitmap register being generated as follows:

g) initializing a pointer for the bitmap and for a 'device counter';

h) initializing a pointer for said page register array and initializing said bitmap register with zeroes;

i) addressing a single cell in said page register array;

j) if its entry is valid, continuing with step k) else continuing with step l);

k) loading N bits from the corresponding bitmap stored in said defects list and logically ORing that with the corresponding bitmap register values;

l) incrementing the page register array pointer and continuing with step i) until the end of said page register array is reached;

m) if the bitmap register value equals zero, incrementing the bitmap pointer and said 'device counter' and continuing with step h) until the end of the bitmap is reached.

14. The apparatus according to claim 13 wherein, if in step m) said bitmap register value not equals zero, the following steps are carried out in order to determine the bus for a defect block in a defect flash device and to copy corresponding flash pages:

n) initializing a 'bus count' and the pointer for said page register array;

o) reading said page register array for a valid value;

p) analyzing the bit in said bitmap register where 'bus count' is pointing to: if that bit equals zero, incrementing 'bus count' and continuing with step o), if that bit equals one, continuing with step q);

q) for all page values between zero and the value read in step o) minus one, copying flash pages from the faulty flash block to a new flash block, whereby the reference flash device number corresponds to value 'device counter' and the reference bus number corresponds to value 'bus count';

r) for the page value read in step o), copying the corresponding flash page data from said additional memory buffer to the new flash block, whereby the reference flash device number corresponds to value 'device counter' and the reference bus number corresponds to value 'bus count';

s) incrementing the pointer for said page register array and continuing with step o) until the end of said page register array is reached;

t) updating a 'block remap table' for the appropriate device and marking the corresponding block entry in said defects list as invalid;

u) continuing with step a) in claim 12.

* * * * *